(12) United States Patent
Ahn et al.

(10) Patent No.: US 7,154,162 B2
(45) Date of Patent: Dec. 26, 2006

(54) INTEGRATED CIRCUIT CAPACITOR STRUCTURE

(75) Inventors: Jeong-Hoon Ahn, Seoul (KR);
Kyungtae Lee, Gyeonggi-do (KR);
Mu-Kyung Jung, Suwon (KR);
Yong-Jun Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/678,531

(22) Filed: Oct. 3, 2003

(65) Prior Publication Data
US 2004/0075131 A1 Apr. 22, 2004

(30) Foreign Application Priority Data
Oct. 17, 2002 (KR) ........................ 10-2002-0063477

(51) Int. Cl.
*H01L 29/00* (2006.01)
(52) U.S. Cl. ........................ 257/532; 257/535
(58) Field of Classification Search ................ 257/379, 257/532, 535; 361/303, 306.1, 717–718, 361/720; 438/396
See application file for complete search history.

(56) References Cited

U.S. PATENT DOCUMENTS

| | | | |
|---|---|---|---|
| 5,194,932 A | 3/1993 | Kurisu | 257/773 |
| 5,208,726 A | 5/1993 | Apel | 257/532 |
| 5,563,762 A * | 10/1996 | Leung et al. | 361/301.4 |
| 5,583,359 A | 12/1996 | Ng et al. | |
| 5,879,985 A | 3/1999 | Gambino et al. | 438/253 |
| 6,034,411 A * | 3/2000 | Wade et al. | 257/536 |
| 6,064,108 A | 5/2000 | Martinez | |
| 6,180,976 B1 | 1/2001 | Roy | |
| 6,184,567 B1 * | 2/2001 | Fujisawa et al. | 257/532 |
| 6,365,954 B1 * | 4/2002 | Dasgupta | 257/532 |
| 6,534,374 B1 * | 3/2003 | Johnson et al. | 438/381 |
| 6,710,425 B1 * | 3/2004 | Bothra | 257/532 |
| 6,756,282 B1 * | 6/2004 | Nagano et al. | 438/396 |
| 6,784,478 B1 * | 8/2004 | Merchant et al. | 257/303 |
| 6,800,923 B1 * | 10/2004 | Yamamoto | 257/532 |
| 6,881,996 B1 * | 4/2005 | Chen et al. | 257/296 |
| 2005/0063135 A1* | 3/2005 | Borland et al. | 361/303 |

FOREIGN PATENT DOCUMENTS

| | | |
|---|---|---|
| EP | 1119027 A2 | 7/2001 |
| EP | 1182708 A2 | 2/2002 |
| JP | 63239970 A * | 10/1988 |

OTHER PUBLICATIONS

Lin, et al. "Single Mask Metal-Metal-Insulator-Metal (MIM) Capacitor with Copper Damascene Metallization for Sub-018μm Mixed Mode Signal and System-on-a Chip (SoC) Applications" IEEE 2000, pp. 111-113, no month cited.

M. Armacost, et al. "A High Reliability Metal Insulator Metal Capacitor for 0.18μm Copper Technology" IEEE 2000, IEDM, pp. 157-160, no month cited.

* cited by examiner

*Primary Examiner*—N. Drew Richards
(74) *Attorney, Agent, or Firm*—Marger Johnson & McCollom, P.C.

(57) ABSTRACT

Embodiments of the invention include a MIM capacitor that has a high capacitance that can be manufactured without the problems that affected the prior art. Such a capacitor includes an upper electrode, a lower electrode, and a dielectric layer that is intermediate the upper and the lower electrodes. A first voltage can be applied to the upper electrode and a second voltage, which is different from the first voltage, can be applied to the lower electrode. A wire layer, through which the first voltage is applied to the upper electrode, is located in the same level as or in a lower level than the lower electrode.

22 Claims, 15 Drawing Sheets

INTEGRATED CIRCUIT CAPACITOR STRUCTURE

RELATED APPLICATION

This application claims priority from Korean Application 2002-63477, filed Oct. 17, 2002, which is incorporated herein for all purposes.

1. Technical Field

The present invention relates to an integrated circuit capacitor and, more specifically, to a metal-insulator-metal (MIM) capacitor structure. Such a structure is particularly advantageous to use in logic, analog, or circuits that include both Dynamic Random Access Memory (DRAM) and Merged DRAM and Logic (MDL) devices.

2. Background

Several types of integrated circuit capacitors exist, which are classified according to their junction structures, such as metal-oxide-silicon (MOS) capacitors, pn junction capacitors, polysilicon-insulator-polysilicon (PIP) capacitors, and metal-insulator-metal (MIM) capacitors. In all of the above-listed capacitors except for MIM capacitors, at least one electrode is formed of monocrystalline silicon or polycrystalline silicon. However, physical characteristics of monocrystalline and polycrystalline silicon limit minimizing the amount of resistance of a capacitor electrode. In addition, when a bias voltage is applied to a monocrystalline or polycrystalline silicon electrode, depletion may occur, which can cause the applied voltage to become unstable. When this occurs, the capacitance of the silicon electrode cannot be maintained at a certain level.

Using MIM capacitors has been proposed to address the varying capacitance problem, since capacitance of MIM capacitors does not depend on a bias voltage or temperature. MIM capacitors have a lower voltage coefficient of capacitance (VCC) and a lower temperature coefficient of capacitance (TCC) than other capacitor types. The VCC indicates variation of capacitance according to the changes in voltage and the TCC indicates variation of capacitance according to the changes in temperature. Because of having a low VCC and TCC, MIM capacitors have been particularly useful for fabricating analog products. More recently, MIM capacitors have been used to make mixed mode signal products and system-on-a-chip (SOC) products. For example, MIM capacitors have been widely employed in analog capacitors and filters for analog or mixed mode signal applications in wired or wireless communications, as decoupling capacitors for main processing unit boards, as high frequency radio-frequency (RF) capacitors, and in embedded DRAMs.

FIGS. 1 and 2 are cross-sectional diagrams of two conventional MIM capacitors as taught by R. Liu et al., Proc. IITC, 111 (2000) and M. Armacost et al., Proc. IEDM, 157 (2000), respectively. Reference numerals 10 and 12 indicate MIM capacitors, and reference numerals 20, 30, 40, and 50 indicate a lower electrode, a dielectric layer, an upper electrode, and a capping layer, respectively. In addition, reference numerals C/P_20, C/P_40, C/H, D/D_20, D/D_40, and D/R indicate a lower electrode contact plug, an upper electrode contact plug, contact holes, a dual damascene wiring layer contacting a lower electrode, a dual damascene wiring layer contacting an upper electrode, and damascene regions, respectively. Other parts of the MIM capacitors 10 and 12 correspond to interlayer or other dielectric layers.

In the MIM capacitor 10 shown in FIG. 1, the lower electrode 20 is electrically connected to a wiring layer (not shown) by the lower electrode contact plug C/P_20 and the upper electrode 40 is electrically connected to another wiring layer (not shown) by the upper electrode contact plug C/P_40. The lower electrode contact plug C/P_20 and the upper electrode contact plug C/P_40 are formed in their respective contact holes C/H having a high aspect ratio but different depths. Specifically, the C/H for the C/P_20 runs deeper than the C/H for the C/P_40, because the C/P 20 contacts the lower electrode 20. When forming the contact hole C/H, it is difficult to precisely control an etching process so as to stop the etching of C/H at the top surface of the upper electrode 40 and at the top surface of the lower electrode 20 simultaneously. Therefore, the upper electrode 40 must be formed to have a predetermined thickness so that it can endure an excessive etching process. However, as the thickness of the upper electrode 40 increases, the dielectric layer 30 under the upper electrode 40 is more likely to be exposed to an excessive etching process for patterning the upper electrode 40, and thus the lower electrode 20 may be exposed due to the dielectric layer 30, which is etched away. Therefore, the dielectric layer 30 must also be formed to have a predetermined thickness so that it can endure an excessive etching process, and this results in a decrease in the capacitance of the entire capacitor 10.

In the MIM capacitor 12 shown in FIG. 2, the dual damascene wiring layer D/D_20 and the dual damascene wiring layer D/D_40 are electrically connected to the lower electrode 20 and the upper electrode 40, respectively. They are formed in their respective damascene regions D/R having a high aspect ratio but different depths. In order to obtain a sufficient margin for an etching process for forming the dual damascene region D/R, in which the dual damascene wiring layer D/D_40 is supposed to be formed, the thickness of the upper electrode 40 and the thickness of the dielectric layer 30 must be increased, which accompanies the decrease in the capacitance of the entire capacitor 12.

In addition, there is a high probability of having a bad electrical contact occur due to byproducts, like polymer, generated during the formation of the contact holes C/H and the damascene regions D/R because they have a high aspect ratio. In other words, the manufacturing process of conventional MIM capacitors results in many disadvantages including limiting the capacitance of a capacitor.

Embodiments of the invention address this and other limitations in the prior art.

BRIEF DESCRIPTION OF THE DRAWINGS

The invention will be understood more fully from the detailed description given below and from the accompanying drawings of particular embodiments of the invention, which, however, should not be taken to limit the invention to the specific embodiments, but are to facilitate explanation and understanding.

DETAILED DESCRIPTION OF THE INVENTION

In the following detailed descriptions, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Embodiments of the invention include a MIM capacitor that has a high capacitance that can be manufactured without the problems that affected the prior art. Such a capacitor includes an upper electrode, a lower electrode, and a dielectric layer that is intermediate the upper and the lower electrodes. A first voltage can be applied to the upper electrode and a second voltage, which is different from the first voltage, can be applied to the lower electrode. A wire layer, through which the first voltage is applied to the upper electrode, is located in the same level as or in a lower-level than the lower electrode.

Figure 3:
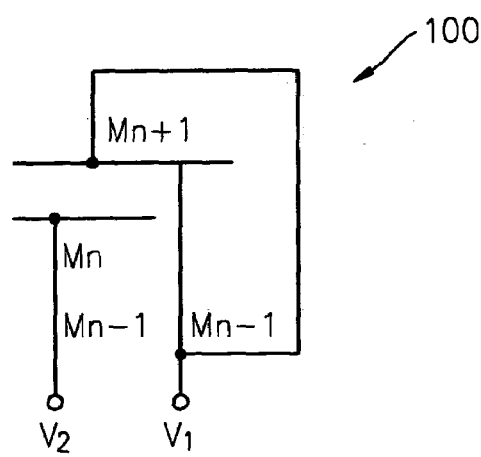
FIG. 3 is an equivalent schematic circuit diagram of an MIM capacitor according to an embodiment of the present invention.

FIG. 3 is an equivalent circuit diagram of an MIM capacitor 100 according to an embodiment of the present invention. The MIM capacitor 100 includes a lower electrode in an $M_n$ level and an upper electrode in an $M_{n+1}$ level. A first voltage $V_1$ is applied to the upper electrode in the $M_{n+1}$ level via a wire layer in an $M_{n-1}$ level, which is lower than the $M_n$ level. A second voltage $V_2$ is applied to the lower electrode in the $M_n$ level via a wire layer in the $M_{n-1}$ level. In this disclosure, $M_{n-1}$ to $M_{n+1}$ represent the levels of n–1th to n+1th wire layers, n being an integer. Depending on the application, the levels of wire layers may vary, and the positions of upper and lower electrodes and wire layers may also vary.

Figure 4:
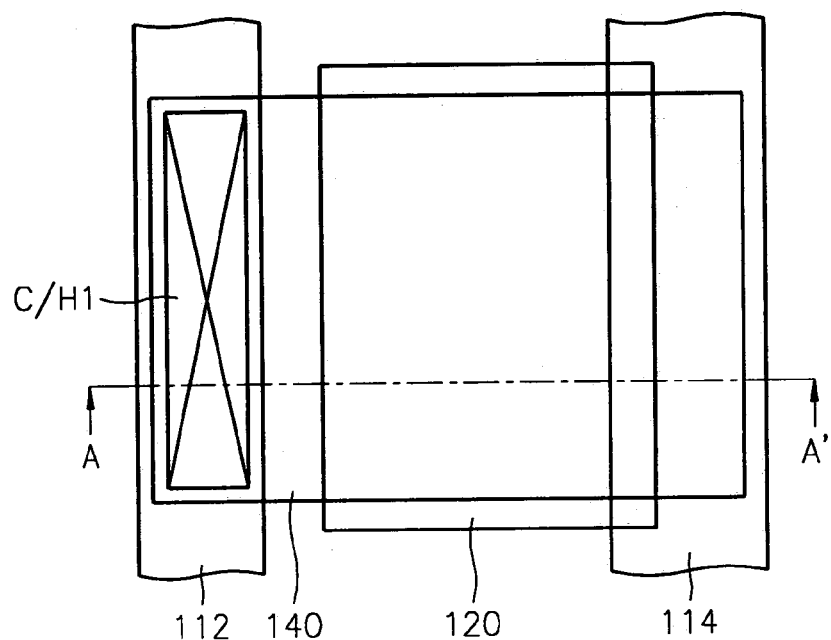
FIG. 4 is an example layout diagram for forming the MIM capacitor according to the schematic diagram of FIG. 3.

The MIM capacitor 100 shown in FIG. 3 may be embodied using a layout such as that shown in FIG. 4. Reference numerals 112, 114, 120, 140, and C/H1 represent a pattern for a first wire layer, a pattern for a second wire layer, a pattern for a lower electrode, a pattern for an upper electrode, and a pattern for a contact hole which exposes the first wire layer, respectively. A first voltage V1 is applied to the first wire layer 112, and a second voltage V2 is applied to the second wire layer 114.

Figure 5:
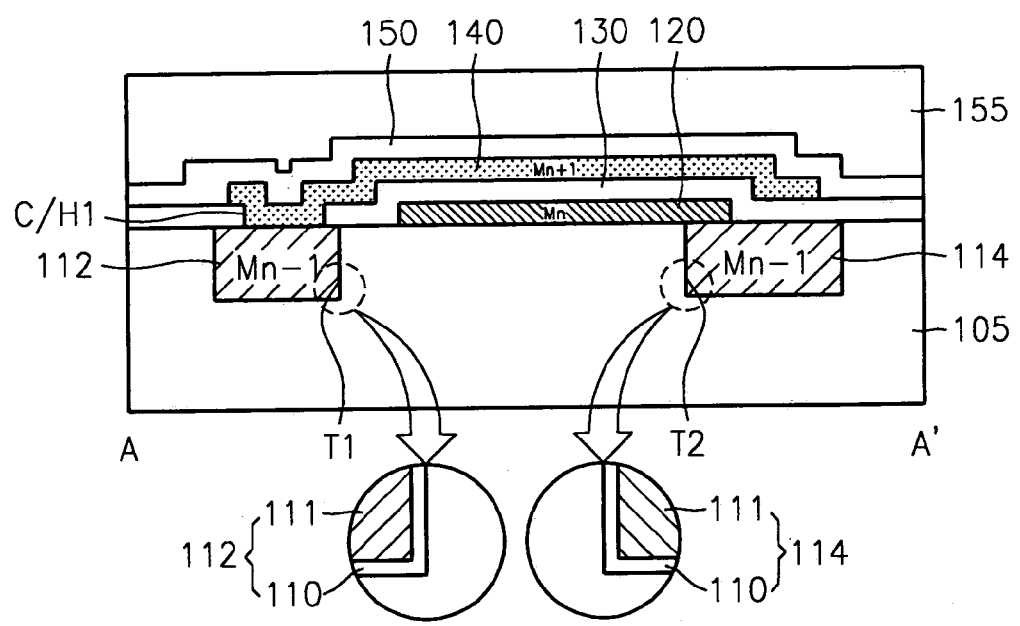
FIGS. 5–7 are cross-sectional diagrams of MIM capacitors formed according to the layout illustrated in FIG. 4.
Figure 6:
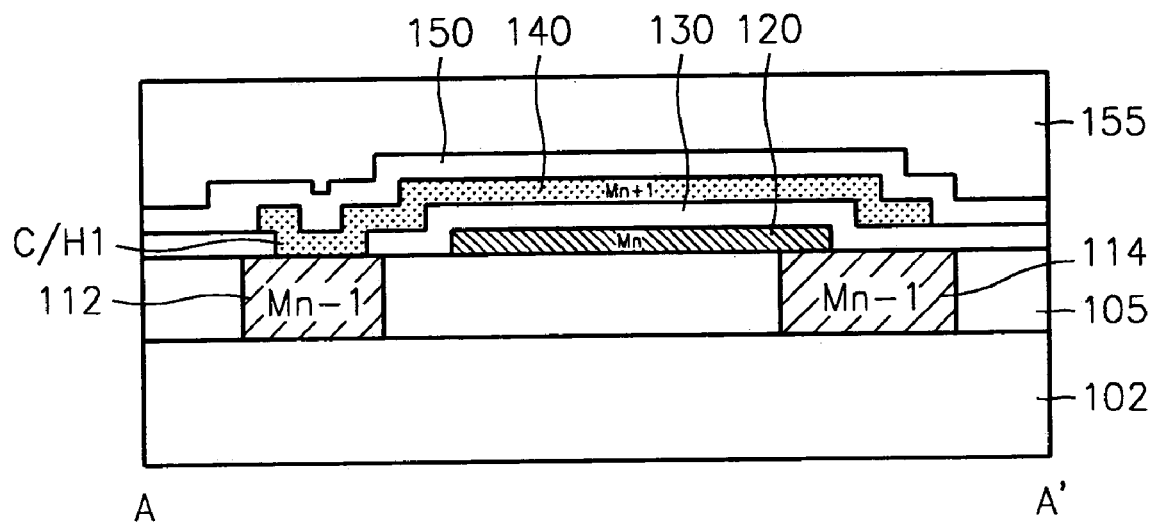
Figure 7:
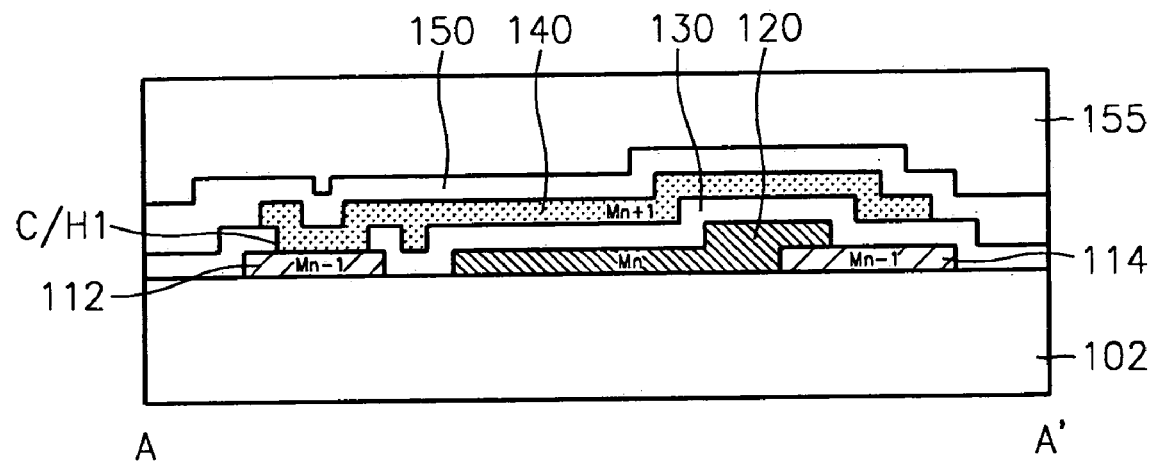

MIM capacitors formed using the layout diagram shown in FIG. 4 may have different cross-sectional shapes as shown in FIGS. 5 through 7, taken along the line A–A'. Referring to FIG. 5, an MIM capacitor has a structure in which an upper electrode 140 is arranged to overlap a lower electrode 120, and a dielectric layer 130 is intermediate the upper and the lower electrodes 140 and 120. The upper electrode 140 is formed of a conductive layer in the $M_{n+1}$ level, and the first wire layer 112 is formed of a conductive layer in the $M_{n-1}$ level. The upper electrode 140 contacts the first wire layer 112, to which the first voltage $V_1$ is applied, through the contact hole C/H1 which is formed in the dielectric layer 130. The lower electrode 120 is formed of a conductive layer in the $M_n$ level and directly contacts the second wire layer 114, without using a contact hole. The second voltage $V_2$ is applied to the second wire 114.

Figure 1:
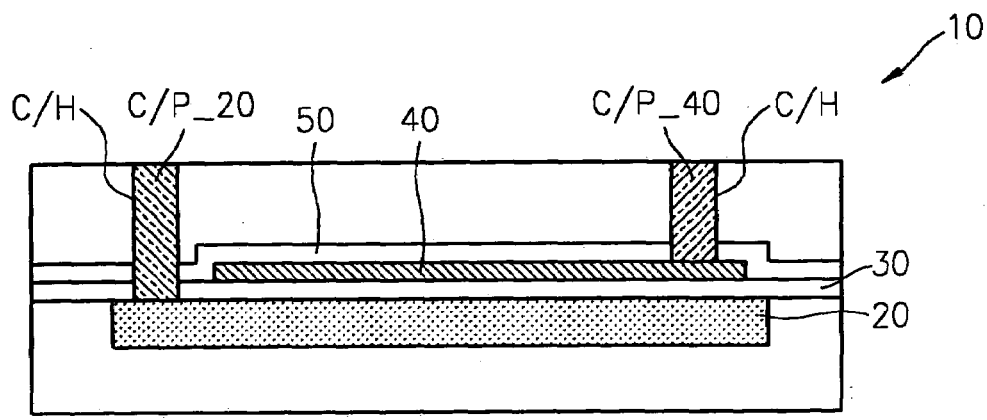
FIGS. 1 and 2 are cross-sectional diagrams of conventional MIM capacitors.
Figure 2:
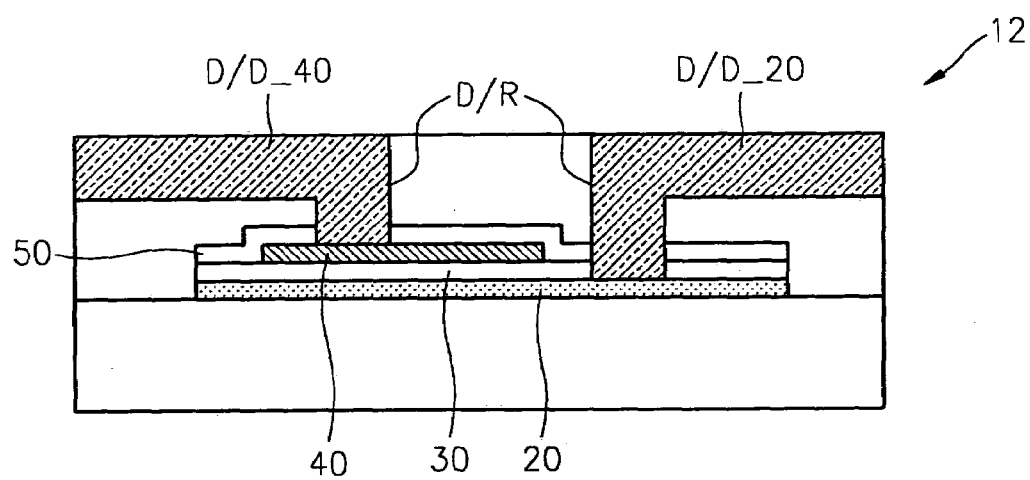

The second wire layer 114 is formed of a conductive layer in the same level as the first wire layer 112. The contact hole C/H1 is formed to expose the surface of the first wire layer 112 before the upper electrode 140 is formed. Therefore, the contact hole C/H1 is completely different from the contact hole C/H in the conventional MIM capacitor 10 shown in FIG. 1 because the contact hole C/H is formed to expose the top surface of the upper electrode 40.

According to embodiments of the present invention, the upper electrode and a dielectric layer do not need to be formed as thick as they formerly were in the conventional techniques. In other words, it is possible to minimize the thickness of the dielectric layer and to still form an MIM capacitor that has a high capacitance. In addition, since the thickness of the dielectric layer 130, in which the contact hole C/H1 is formed, is very small, the aspect ratio of the contact hole C/H1 is also very small. Accordingly, the problems accompanied by the contact holes C/H of FIG. 1, which have a high aspect ratio, are much less likely to occur in the present embodiment.

As shown in FIG. 5, it is preferable that the first and the second wire layers 112 and 114 are formed in a damascene wiring layer embedded in an interlayer dielectric layer 105 so as to have a planarized top surface to minimize a step difference. The damascene wiring layer is formed by depositing a conductive layer in trenches $T_1$ and $T_2$ formed in the interlayer dielectric layer 105 and by performing chemical mechanical polishing (CMP). The damascene wiring layer may include a barrier metal layer 110 formed at the inner sidewalls and the bottom surface of each of the trenches $T_1$ and $T_2$ and a conductive layer 111 filling the trenches $T_1$ and $T_2$.

The upper electrode 140 is covered with an upper interlayer dielectric layer so that it can be insulated from an upper structure (not shown). The upper interlayer dielectric layer is preferably a capping layer 150 for protecting the upper electrode 140 and an interlayer dielectric layer 155.

Connections between the first and second wire layers 112 and 114 and other wire layers and processes of manufacturing wire layers in a level higher than the $M_{n+1}$ level may vary depending on the application.

The sizes of the upper and lower electrodes 140 and 120 may also vary depending on the application, preferably, to maximize the effective area of a capacitor electrode, i.e., the surface area of the upper and lower electrodes 140 and 120 facing each other.

In FIG. 6, unlike in the structure shown in FIG. 5 where the first and second wire layers 112 and 114 are formed by performing CMP on conductive layers, the first and second wire layers 112 and 114 are formed by performing CMP on an interlayer dielectric layer 105. In other words, a conductive layer is formed on a lower interlayer dielectric layer 102 and is patterned using a conventional photolithography process, thus forming patterns for the first and second wire layers 112 and 114. Next, the interlayer dielectric layer 105 is deposited on the lower interlayer dielectric layer 102, and a CMP process is performed on the interlayer dielectric layer 105 so that it can be level with the top surfaces of the patterns for the first and second wire layers 112 and 114. Other elements of the MIM capacitor shown in FIG. 6 and their structures are the same as the corresponding elements of the MIM capacitor shown in FIG. 5 and their structures.

Referring to FIG. 7, the first and the second wire layers 112 and 114 are very thin and thus do not need to be planarized by performing CMP. In particular, the first and the second wire layers 112 and 114 are wiring patterns formed on a lower interlayer dielectric layer 102 by patterning. A lower electrode 120 is patterned so as to be isolated from the first wire layer 112 but to directly contact the second wire layer 114. The isolation of the first wire layer 112 from the lower electrode 120 is accomplished by forming a dielectric layer 130 as illustrated. Other elements of the MIM capacitor shown in FIG. 7 and their structures are the same as the corresponding elements of the MIM capacitor shown in FIG. 5 and their structures, and will therefore not be discussed further.

Figure 8:
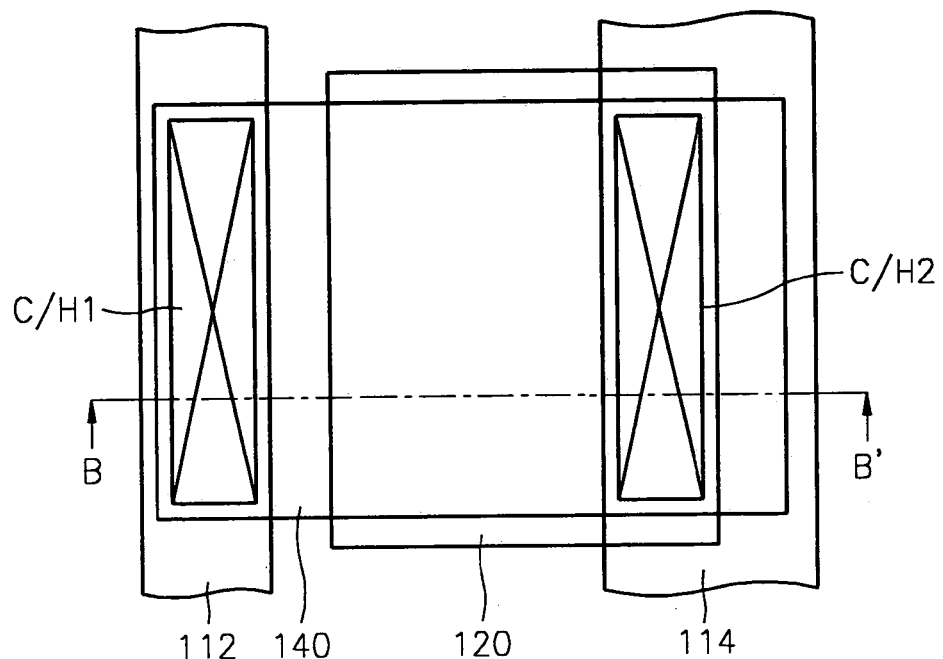
FIG. 8 is an example layout diagram for forming the MIM capacitor according to the schematic diagram of FIG. 3.

FIG. 8 is another example layout for forming the MIM capacitor according to the schematic diagram of FIG. 3. This layout is different from the layout illustrated in FIG. 4 in that a pattern for a contact hole C/H2, through which the top surface of a second wire layer 114 will be exposed, is further included.

Figure 9:
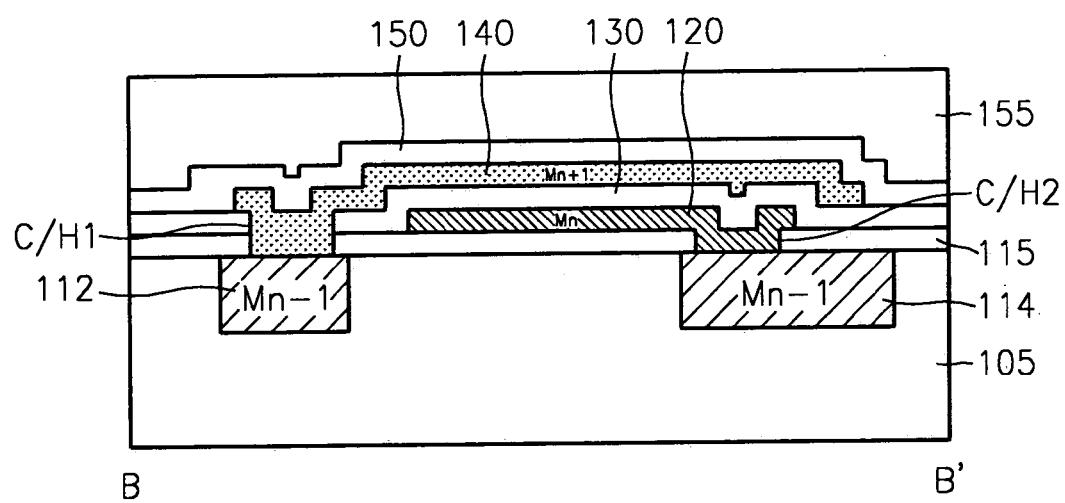
FIGS. 9–11 are cross-sectional diagrams of MIM capacitors formed according to the layout illustrated in FIG. 8.
Figure 10:
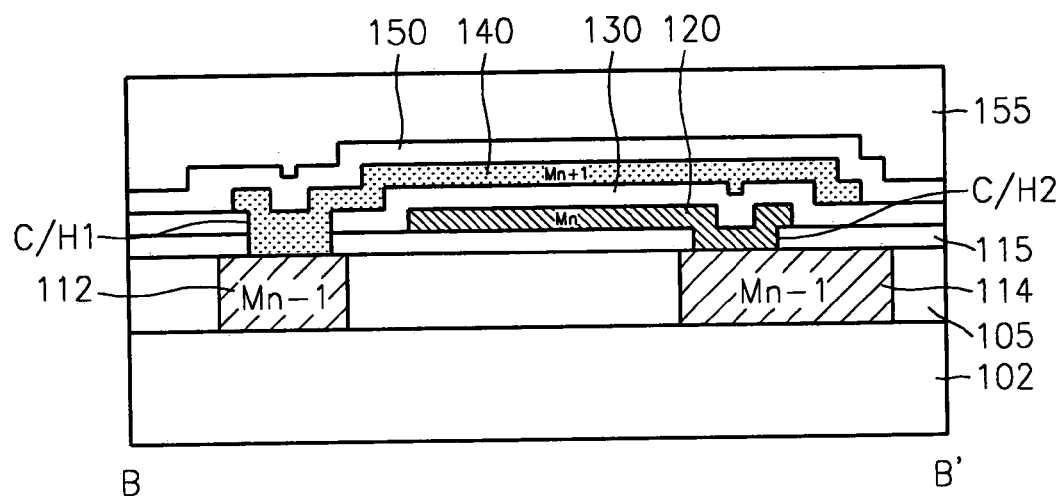
Figure 11:
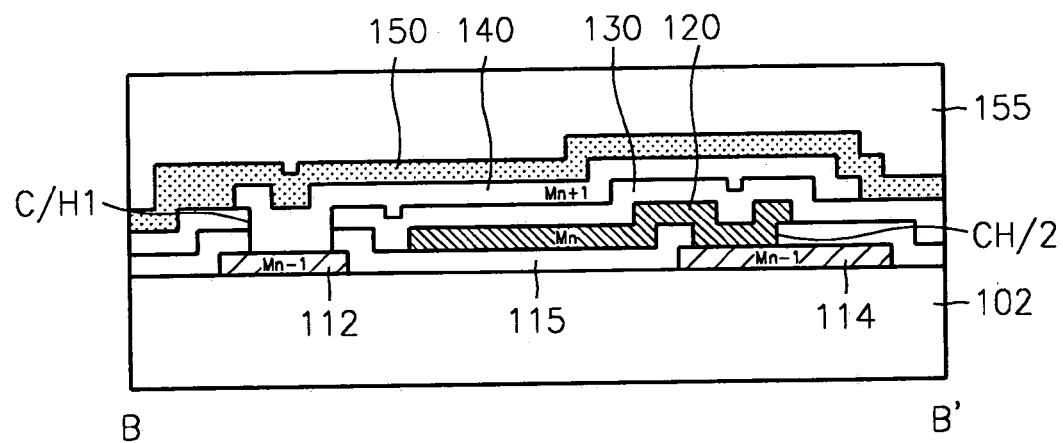

FIGS. 9 through 11 are cross-sectional diagrams of MIM capacitors according to the layout shown in FIG. 8, taken along line B–B' of FIG. 8.

Referring to FIG. 9, an upper interlayer dielectric layer 115 is formed on a lower interlayer dielectric layer 105, in which first and second wire layers 112 and 114 are embedded, and a lower electrode 120 is formed on the interlayer dielectric layer 115. The lower electrode 120 is the same as the corresponding element of FIG. 5 except that it is formed to directly contact the second wire layer 114 through the contact hole C/H2, which is formed in the upper interlayer dielectric layer 115. Additionally, an upper electrode 140 is formed to directly contact the first wire layer 112 through a contact hole C/H1 formed in a dielectric layer 130 and the upper interlayer dielectric layer 115. The contact hole C/H1 has a low aspect ratio since the contact hole C/H1 is formed in the dielectric layer 130 and the upper interlayer dielectric layer 115.

Referring to FIG. 10, CMP is performed on an interlayer dielectric layer 105 to make the top surfaces of first and second wire layers 112 and 114 be level with each other. As a result of the CMP, the first and second wire layers 112 and 114 are embedded in the interlayer dielectric layer 105.

An MIM capacitor shown in FIG. 11 is similar to the one shown in FIG. 9 except that an interlayer dielectric layer 115 is formed after patterning the first and second wire layers 112 and 114, without performing CMP.

Figure 12:
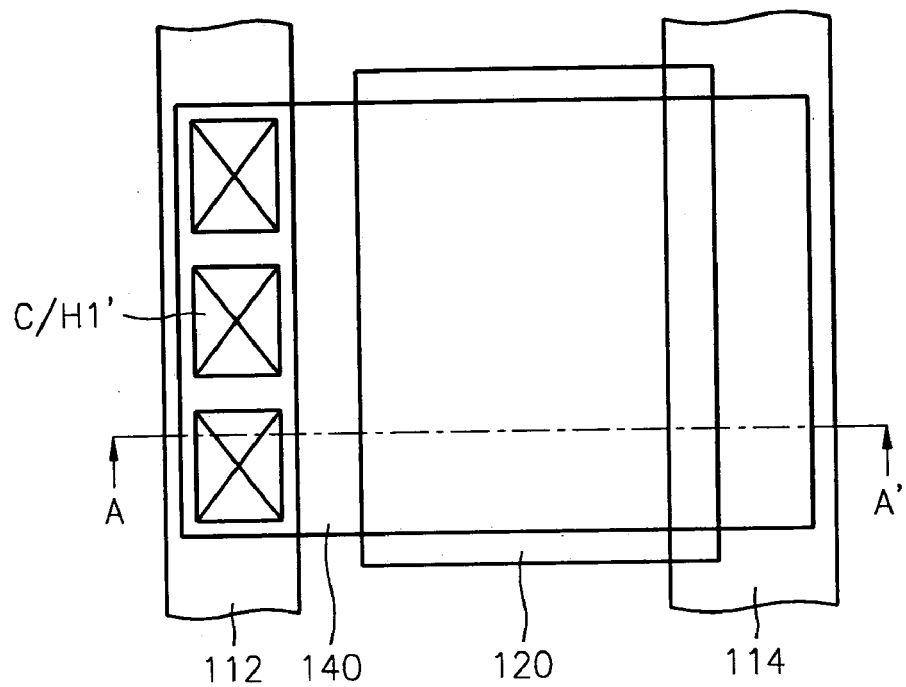
FIGS. 12–13 are additional example layout diagrams for forming the MIM capacitor according to the schematic diagram of FIG. 3.
Figure 13:
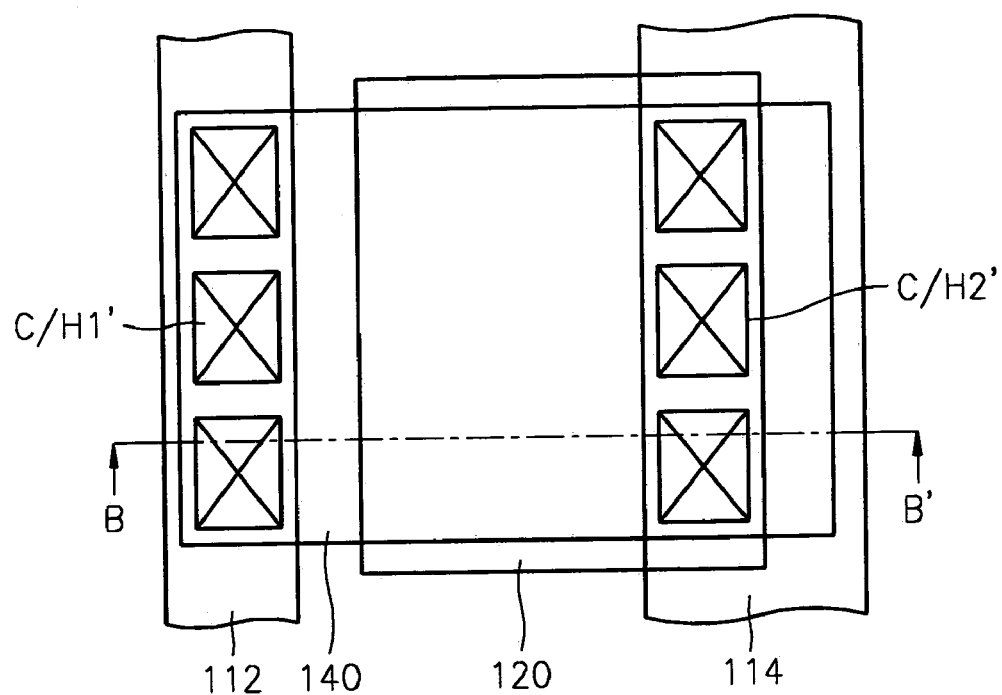

FIGS. 12 and 13 are further example layouts for forming the MIM capacitor according to the schematic diagram of FIG. 3. These layout diagrams are different from the layouts of FIGS. 4 and 8 in that patterns for contact holes C/H1' and C/H2' include a multitude of separate patterns.

Figure 14:
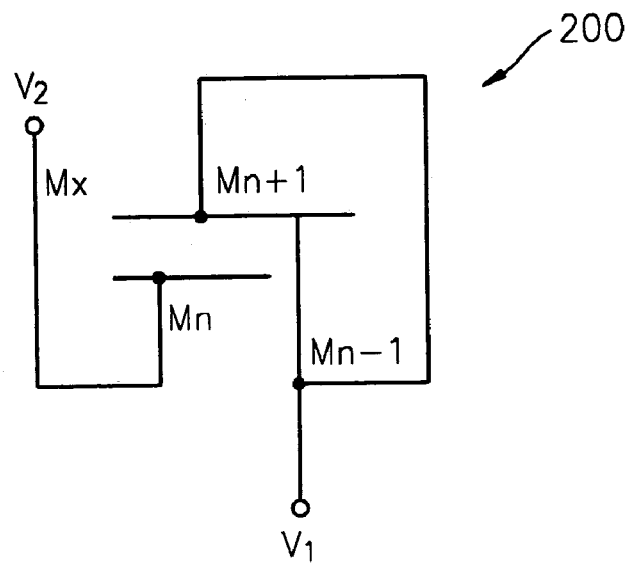
FIG. 14 is an equivalent schematic circuit diagram of an MIM capacitor according to another embodiment of the invention.

FIG. 14 is an equivalent circuit diagram of an MIM capacitor 200 according to another embodiment of the invention. The MIM capacitor 200 includes a lower electrode formed in the $M_n$ level and an upper electrode formed in the $M_{n+1}$ level. A first voltage $V_1$ is applied to the upper electrode via a wire layer formed in the $M_{n-1}$ level, which is lower than the level of the lower electrode. A second voltage $V_2$ is applied to the lower electrode via a wire layer formed in a $M_x$ level (here, x>n+1).

Figure 15:
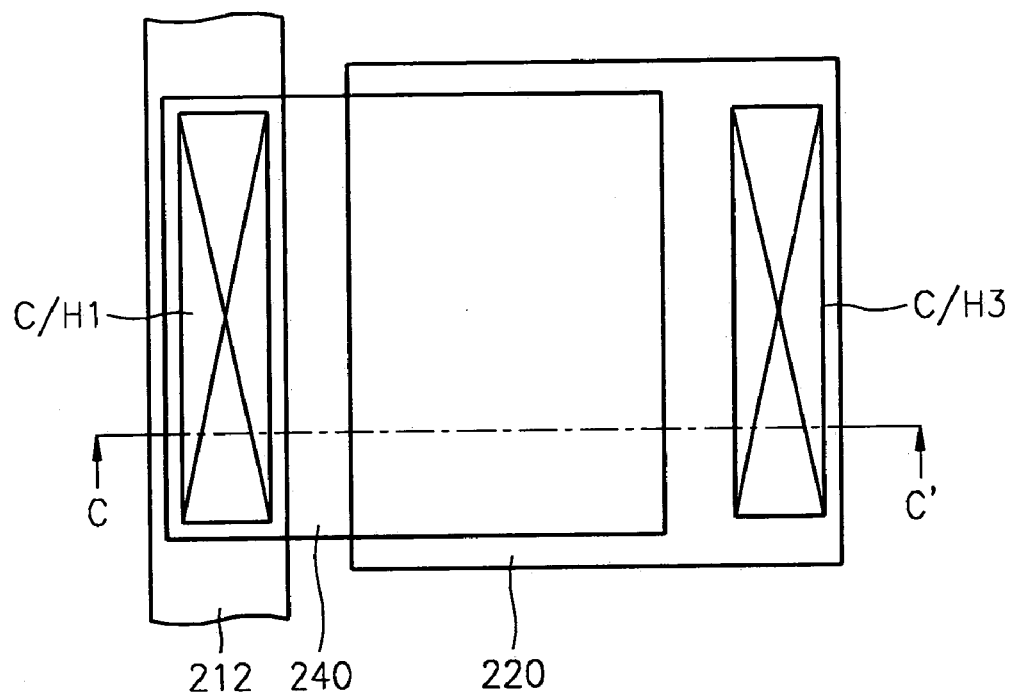
FIG. 15 is an example layout diagram for forming the MIM capacitor according to the schematic diagram of FIG. 14.
Figure 16:
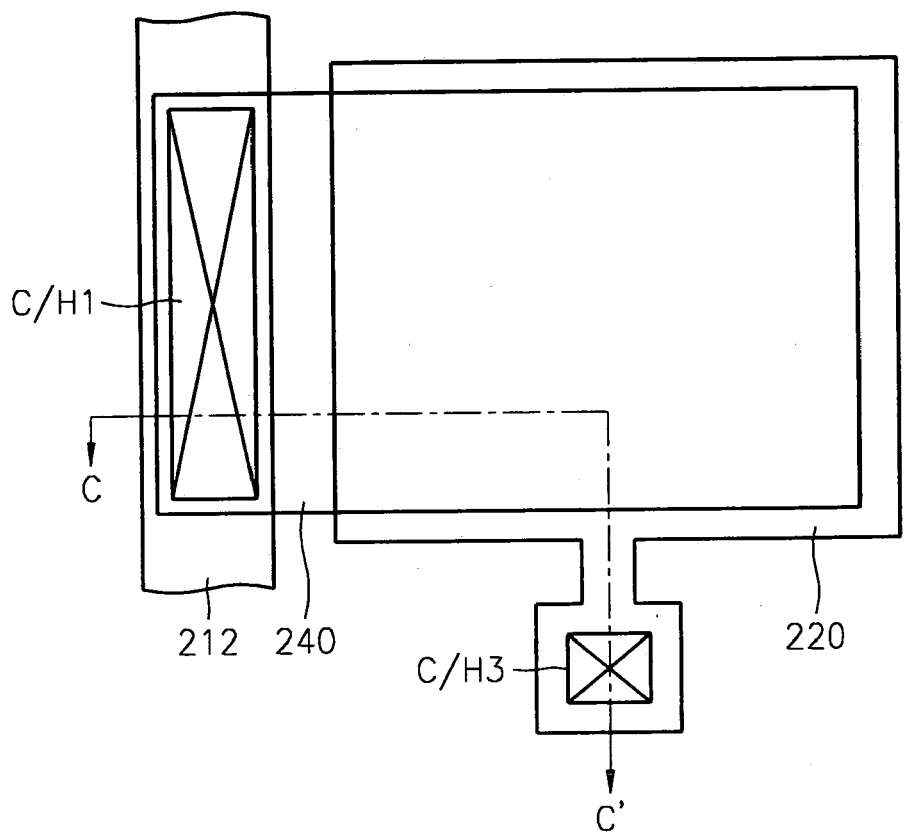
FIG. 16 is another example layout diagram for forming the MIM capacitor according to the schematic diagram of FIG. 14.

The MIM capacitor 200 according to this embodiment of the invention may be embodied using layouts such as example layout diagrams shown in FIGS. 15 and 16. Reference numerals 212, 220, and 240 represent a first wire layer pattern, a lower electrode pattern, and an upper electrode pattern, respectively. The first reference voltage V1 is applied to the wire layer pattern 212. Reference numerals C/H1 and C/H3 represent a contact hole pattern for exposing the first wire layer 212 and a contact hole pattern for exposing the lower electrode 220, respectively. The layout pattern of FIG. 16 maximizes the effective area of an MIM capacitor. In FIG. 16, the lower electrode pattern 220 has a protrusion along one edge and the contact hole pattern C/H3 is arranged in the protrusion. The contact hole patterns C/H2 and C/H3 may be substituted by a multitude of separated patterns, as was illustrated in FIGS. 12 and 13.

Figure 17:
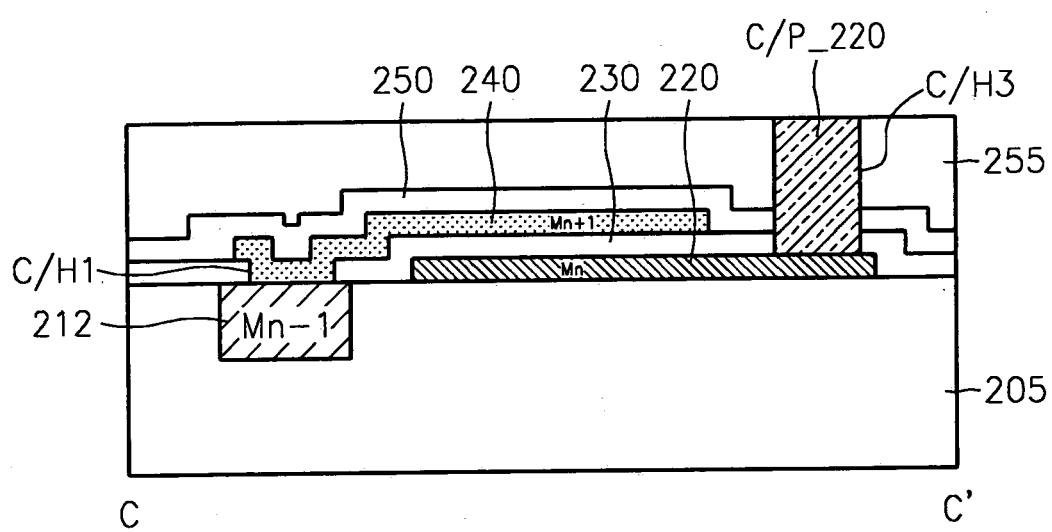
FIGS. 17–18 are cross-sectional diagrams of MIM capacitors formed according to the layout shown in FIG. 15.
Figure 18:
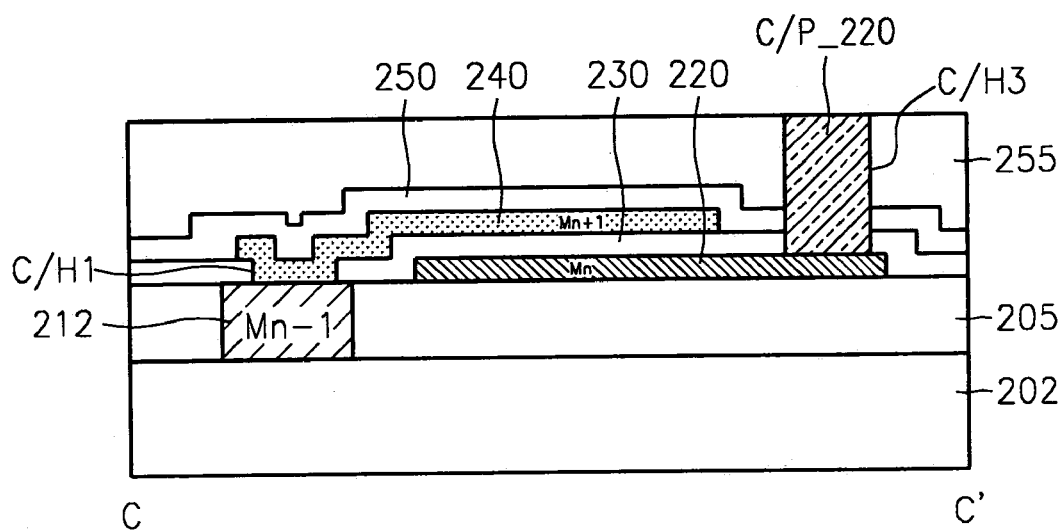
Figure 19:
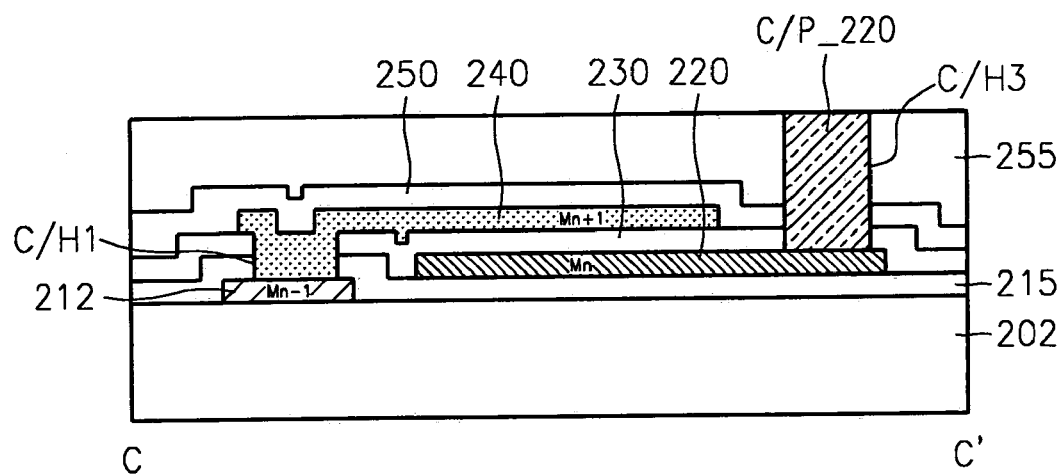
FIG. 19 is a cross-sectional diagram of a MIM capacitor formed according to the layout shown in FIG. 16.

The cross-sections of MIM capacitors formed using the layouts shown in FIG. 15 or 16 have different structures, as shown in FIGS. 17 through 19.

Referring to FIG. 17, an MIM capacitor has a structure where an upper electrode 240 is arranged to overlap a lower electrode 220, and a dielectric layer 230 is positioned between the upper and the lower electrodes 240 and 220. The upper electrode 240 contacts a first wire layer 212, to which the first voltage $V_1$ is applied, via a contact hole C/H1 through which the top surface of the first wire layer 212 is exposed. The upper electrode 240 is formed of a conductive layer in the $M_{n+1}$ level, the first wire layer 212 is formed of a conductive layer in the $M_{n-1}$ level, and the lower electrode 220 is formed of a conductive layer in the $M_n$ level. The lower electrode 220 contacts a second wire layer (not shown) in the $M_x$ level (here, x>n+1), to which the second voltage $V_2$ is applied, via a contact plug C/P_220 which fills a contact hole C/H3. The contact hole C/H3 is formed in upper interlayer dielectric layers 255 and 250 and a dielectric layer 230 so as to expose the top surface of the lower electrode 220. According to this embodiment of the present invention, even though the lower electrode 220 is connected to the second wire layer via the contact plug C/P_220, it is possible to form an MIM capacitor having a minimized thickness dielectric layer.

FIG. 18 shows the structure of an MIM capacitor, in which a first wire layer 212 is embedded in an interlayer dielectric layer 205 planarized by performing CMP. FIG. 19 shows the structure of another MIM capacitor in which a first wire layer 212 is isolated from a lower electrode 220 by forming another interlayer dielectric layer 215, after forming the first wire layer 212 on a lower interlayer dielectric layer 202. In the MIM capacitor illustrated in FIG. 19, no CMP process is performed.

Figure 20:
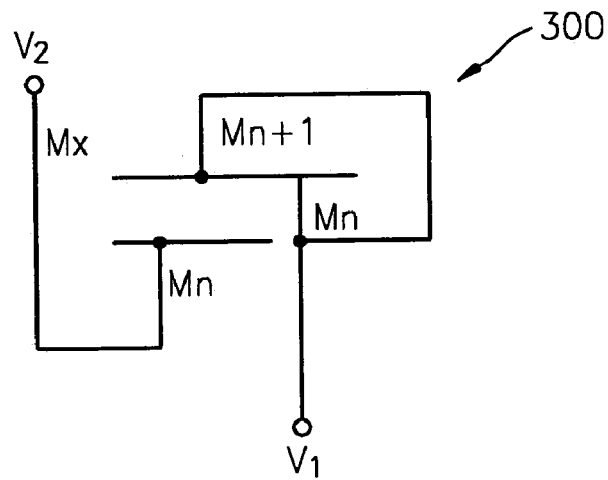
FIG. 20 is an equivalent schematic circuit diagram of an MIM capacitor according to yet another embodiment of the invention.

FIG. 20 is an equivalent circuit diagram of an MIM capacitor 300 according to yet another embodiment of the present invention. The MIM capacitor 300 includes a lower electrode formed in the $M_n$ level and an upper electrode formed in the $M_{n+1}$ level. The first voltage $V_1$ is applied to the upper electrode via a wire layer formed in the same level ($M_n$) as the lower electrode. The second voltage $V_2$ is applied to the lower electrode of the Mn level via a wire layer formed in a $M_x$ level (here, x>n+1).

Figure 21:
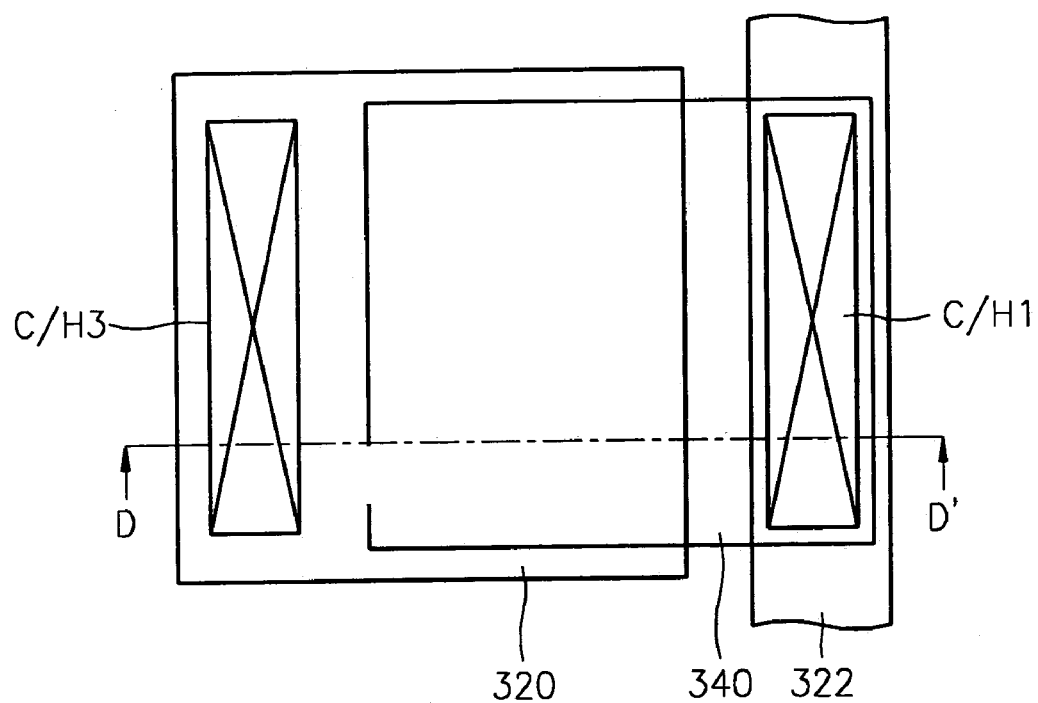
FIG. 21 is an example layout diagram for forming a MIM capacitor according to the schematic diagram of FIG. 20.
Figure 22:
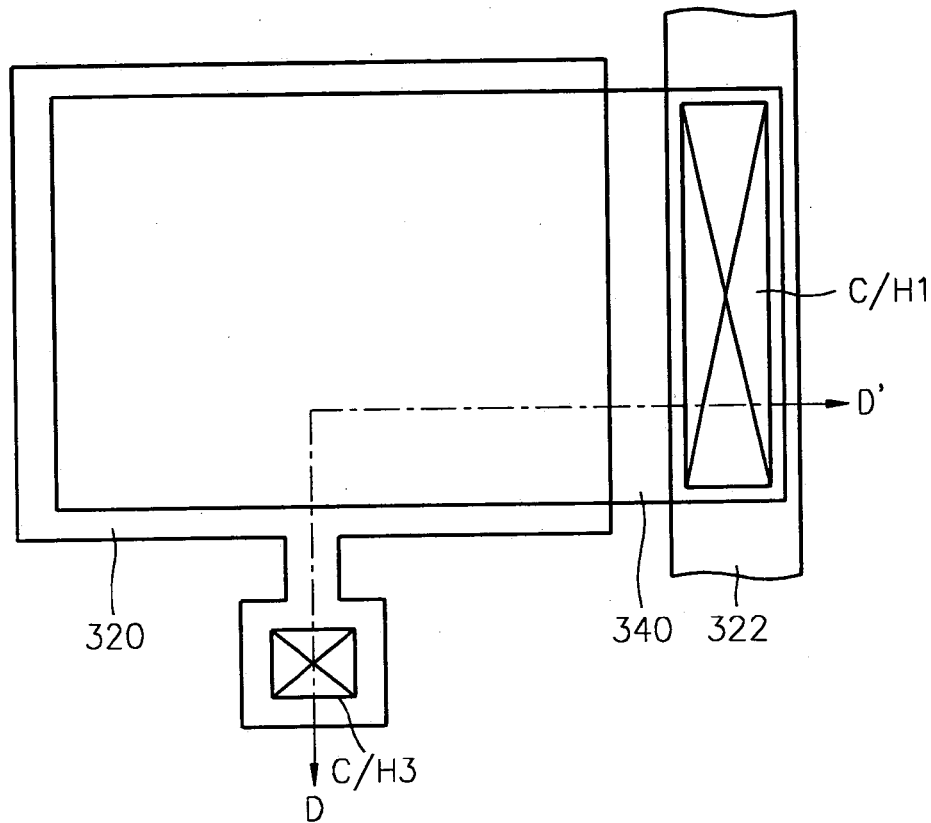
FIG. 22 is another example layout diagram for forming a MIM capacitor according to the schematic diagram of FIG. 20.

The MIM capacitor 300 according to this embodiment may be embodied using the layouts such as the example layouts shown in FIG. 21 or 22. In FIG. 21, reference numerals 320, 322, and 340 represent a lower electrode pattern, a first wire layer pattern, to which the first voltage $V_1$ is applied, and an upper electrode pattern, respectively. Reference numerals C/H1 and C/H3 respectively represent a contact hole pattern through which a first wire layer 322 is exposed and a contact hole through which a lower electrode is exposed. FIG. 22 is an example layout diagram for forming an MIM capacitor so as to maximize the effective area of the MIM capacitor even more. The layout shown in FIG. 22 is the same as the one shown in FIG. 21 except that the lower electrode pattern 320 has a protrusion along one edge and the contact hole pattern C/H3 is arranged in the protrusion. As illustrated in FIGS. 12 and 13, the contact hole patterns C/H2 and C/H3 may be formed using several separated patterns.

Figure 23:
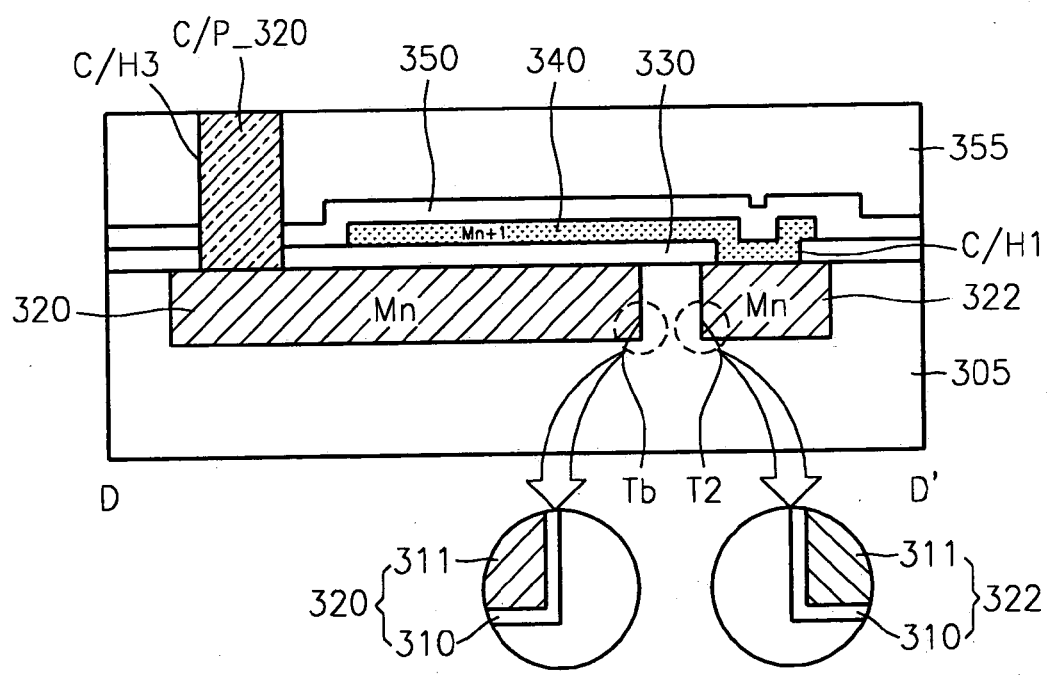
FIGS. 23–24 are cross-sectional diagrams of MIM capacitors formed according to the layout shown in FIG. 21.
Figure 24:
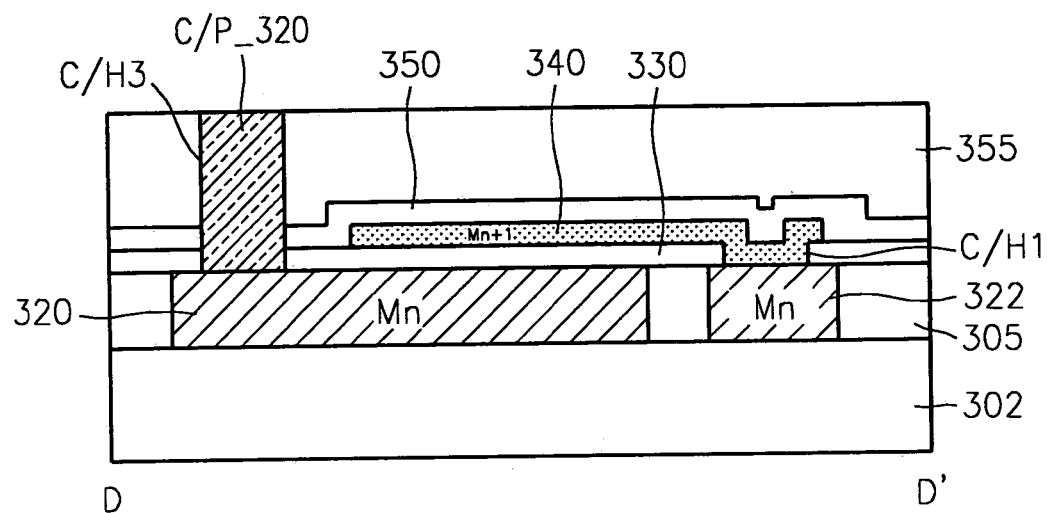
Figure 25:
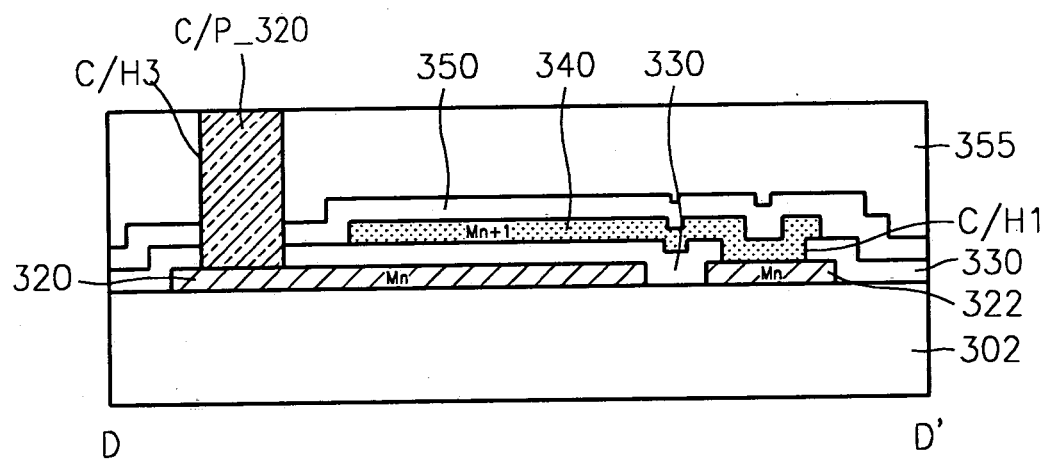
FIG. 25 is a cross-sectional diagram of a MIM capacitor formed according to the layout shown in FIG. 22.

The cross-sections of MIM capacitors embodied using the layouts shown in FIG. 21 or 22 may have different structures, as shown in FIGS. 23 through 25, which are cross-sectional diagrams of such MIM capacitors, taken along lines D–D' of FIGS. 21 and 22.

Referring to FIG. 23, an upper electrode 340 is arranged to overlap a lower electrode 320, and a dielectric layer 330 is positioned between the upper and lower electrodes 340 and 320. The upper electrode 340 contacts a first wire layer 322, to which the first voltage $V_1$ is applied, through a contact hole C/H1 which is formed in the dielectric layer 330 to expose the first wire layer 322. The upper electrode 340 is formed of a conductive layer in the $M_{n+1}$ level, the first wire layer 322 is formed of a conductive layer in the $M_n$ level, and the lower electrode 320 is formed of a conductive layer of the $M_n$ level. A contact plug C/P_320 is formed to fill the contact hole C/H3 which is formed in interlayer dielectric layers 355 and 350 and through the dielectric layer 330 to expose the top surface of the lower electrode 320. The lower electrode 320 is connected to a second wire layer (not shown) in the $M_x$ level (here, x>n+1). The second voltage $V_2$ is applied to the lower electrode 320 by means of the contact plug C/P_320 which is formed within the contact hole C/H3.

In terms of minimizing a step difference, it is preferable that the top surfaces of the lower electrode 320 and the first wire layer 322 are level with each other. In FIG. 23, the lower electrode 320 and the first wire layer 322 are damascene wire layers which are formed by depositing a conductive layer in trenches $T_b$ and $T_2$, which are formed in a dielectric layer 305, and planarizing the conductive layer using CMP. The damascene wire layers include a barrier metal layer 310 formed at the inner walls and bottom of each of the trenches $T_b$ and $T_2$ and a planarized conductive layer 311 formed filling the trenches $T_b$ and $T_2$. Connections between the first wire layer 322 and other wire layers and processes for manufacturing wire layers in a level higher than the $M_{n+1}$ level may vary depending on the application.

An MIM capacitor shown in FIG. 24 is the same as the MIM capacitor shown in FIG. 23 except that a lower electrode 320 and a first wire layer 322 are located on a lower interlayer dielectric layer 302 and are embedded in an interlayer dielectric layer 305, which has been planarized by performing CMP.

Referring to FIG. 25, a lower electrode 320 and a first wire layer 322 are thinly formed on a lower interlayer dielectric layer 302. Thus, it is possible to make an MIM capacitor without performing a CMP process, if the lower electrode 320 and the first wire layer 322 can be electrically disconnected using only a dielectric layer 330.

Next, an example method for manufacturing the MIM capacitor shown in FIG. 5 using the layout shown in FIG. 4, will be described with reference to FIGS. 26 through 29.

Figure 26:
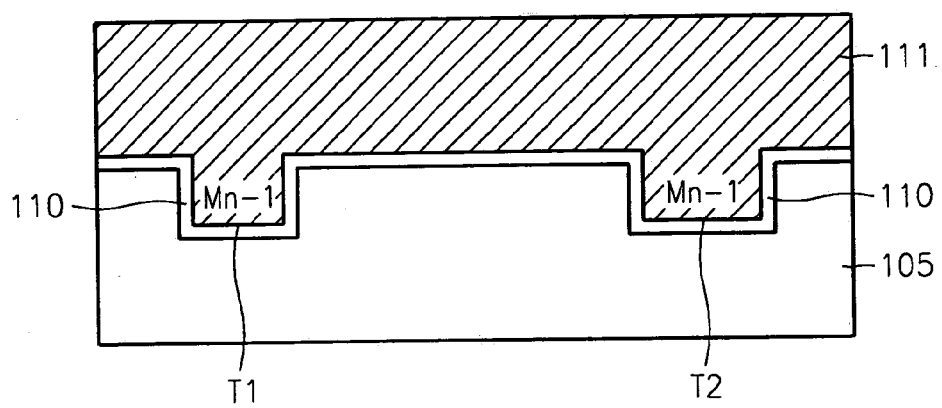
FIGS. 26–29 are cross-sectional diagrams illustrating a method for manufacturing a MIM capacitor shown in FIG. 5.

Referring to FIG. 26, trenches $T_1$ and $T_2$ are formed in an interlayer dielectric layer 105 on a substrate (not shown). A barrier layer 110 is formed at the inner walls and the bottom of the first and second trenches $T_1$ and $T_2$ that are formed in the dielectric layer 105. The barrier layer 110 may be formed of a transition metal layer, a transition metal alloy layer, or a transition metal compound layer, or any combination thereof. For example, the barrier layer 110 may be formed of a Ta layer, a TaN layer, a TaSiN layer, a TiN layer, a TiSiN layer, a WN layer, or a WSiN layer. The barrier layer 110 is introduced to prevent metal atoms of the metal layer filling the first and second trenches $T_1$ and $T_2$ from diffusing into the interlayer dielectric layer 105. Next, a conductive layer 111, for example, a metal layer, is formed on the barrier layer 110 to completely fill the first and second trenches $T_1$ and $T_2$.

The conductive layer 111 may be formed of any low-resistance material that is appropriate for a damascene processes. For example, the conductive layer 111 may be formed of a copper (Cu) layer. In particular, a copper seed layer is formed on the barrier layer 110 which is formed at the inner walls and the bottom of the trenches $T_1$ and $T_2$. Next, the conductive layer 111 comprised of a copper layer is formed on the copper seed layer to completely fill the trenches $T_1$ and $T_2$ using electroplating.

Figure 27:
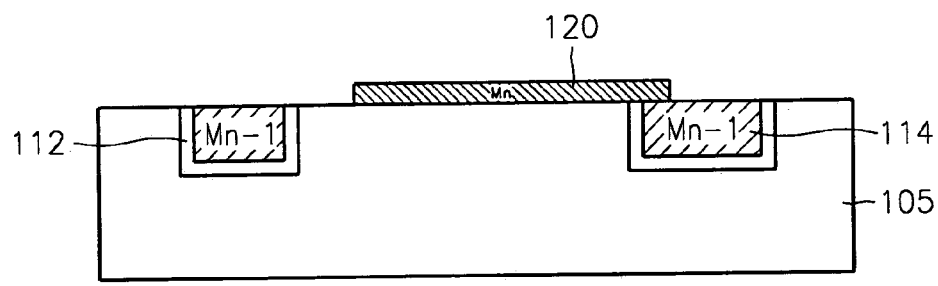

Thereafter, as shown in FIG. 27, the conductive layer 111 and the barrier layer 110 are planarized using CMP until the top surface of the interlayer dielectric layer 105 is exposed. As a result of the planarization, wire layers at a $M_{n-1}$ level, i.e., first and second wire layers 112 and 114, are formed without having a step difference.

Next, a conductive level at a $M_n$ level is deposited on the entire surface of the substrate and is patterned using conventional photolithography so that a lower electrode 120 is formed to directly contact the second wire layer 114. The lower electrode 120 may be formed of a metal layer, a metal compound layer, or a combination thereof, for instance. For example, the lower electrode 120 may be formed of an Al layer, a Ta layer, a TaN layer, a TaSiN layer, a TiN layer, a TiSiN layer, a WN layer, a WSiN layer, or any combination thereof. Alternatively, the lower electrode 120 may be formed of a double layer of a Ta layer and a Cu layer, a double layer of a TaN layer and a Cu layer, a triple layer of a Ta layer, a TaN layer, and a Cu layer, or a triple layer of a TiN layer, a AlCu layer, and a TiN layer and so on.

Figure 28:
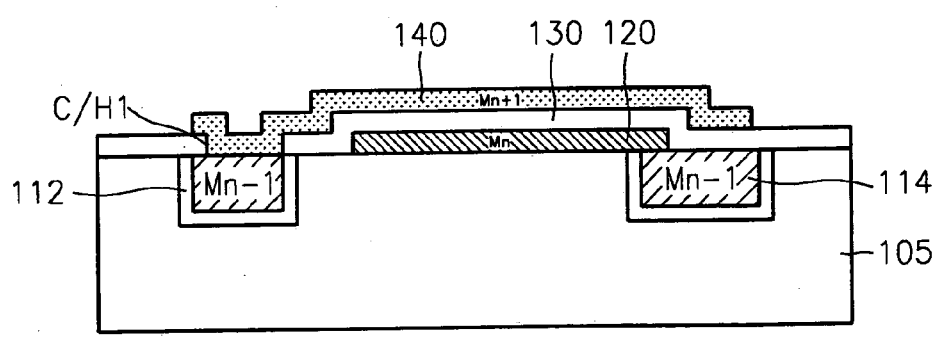

Next, as shown in FIG. 28, a dielectric layer 130 is formed on the entire surface of the substrate on which the lower electrode 120 is formed, and is patterned to form a contact hole C/H1 through which the first wire layer 112 is exposed. The dielectric layer 130 may be formed of any material as long as the dielectric constant of the material is high enough to enhance the capacitance of the eventual MIM capacitor. For example, the dielectric layer 130 may be formed of a $SiO_2$ layer, a $Si_xN_y$ layer, a $Si_xC_y$ layer, a $Si_xO_yN_z$ layer, a $Si_xO_yC_z$ layer, an $Al_xO_y$ layer, a $Hf_xO_y$ layer, or a $Ta_xO_y$ layer. If the lower electrode 120 is formed of a copper-based material, the dielectric layer 130 is preferably formed of a $Si_xN_y$ layer, a $Si_xC_y$ layer, a double layer of a $Si_xN_y$ layer and an oxide layer, or a double layer of a $Si_xC_y$ layer and an oxide layer. For example, the dielectric layer 130 may be formed of a double layer of a $Si_xN_y$ layer and a $Si_xO_yC_z$ layer, a double layer of a $Si_xN_y$ layer and a TEOS layer, a double layer of $Si_xN_y$ layer and a PEOX layer, a double layer of $Si_xC_y$ layer and a $Si_xO_yC_z$ layer, a double layer of a $Si_xC_y$ layer and a TEOS layer, or a double layer of a $Si_xC_y$ layer and a PEOX layer. It is possible to enhance the leakage-current characteristics of a capacitor by forming the dielectric layer 130 of a double layer of a $Si_xN_y$ layer and an oxide layer or a double layer of a $Si_xC_y$ layer and an oxide layer.

Thereafter, a conductive layer of a $M_{n+1}$ level is deposited on the entire surface of the substrate and is patterned using conventional photolithography, thus forming an upper electrode 140 to contact the first wire layer 112 via the contact hole C/H1. Here, the upper electrode 140 may be formed of the same conductive layer as the lower electrode 120.

Figure 29:
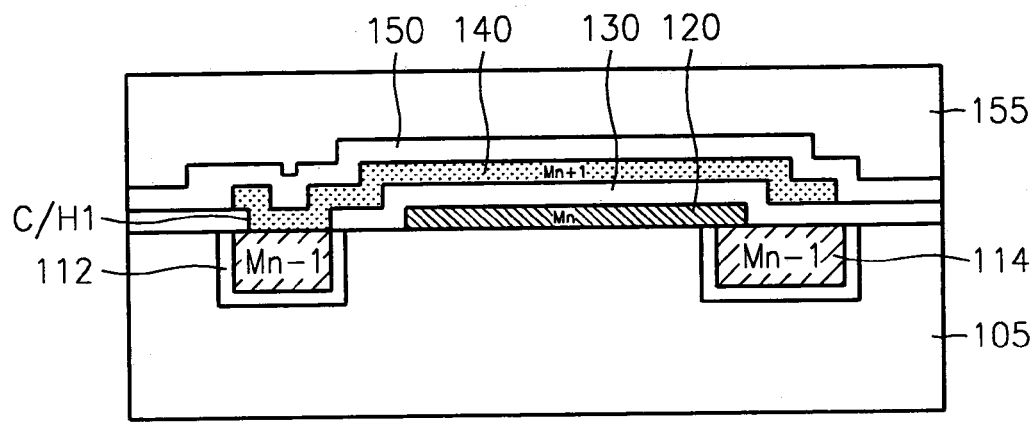

Next, as shown in FIG. 29, a capping layer 150 and an interlayer dielectric layer 155 are sequentially formed to protect the upper electrode 140. The capping layer 150 and the interlayer dielectric layer 155 may be formed of a TEOS layer, a PEOX layer, a $Si_xO_yC_z$ layer, a $Si_xO_yF_z$ layer, or a $Si_xN_y$ layer. Connections between the first and second wire layers 112 and 114 and other wire layers and processes of manufacturing wire layers in a level higher than the $M_{n+1}$ level may vary depending on the application.

Figure 30:
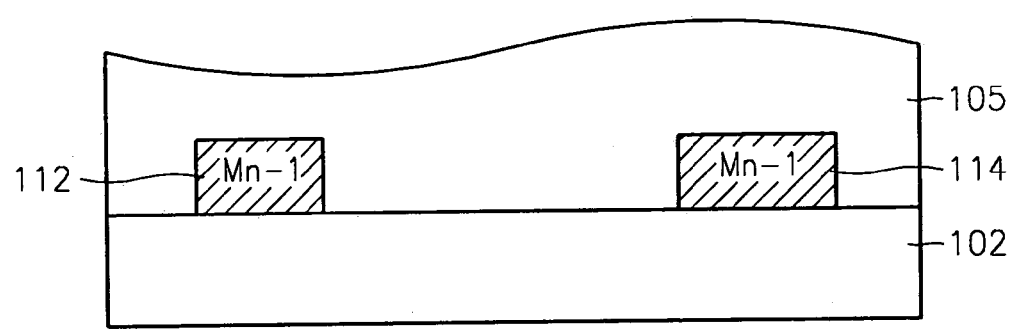
FIGS. 30–31 are cross-sectional diagrams illustrating a method for manufacturing a MIM capacitor shown in FIG. 6.
Figure 31:
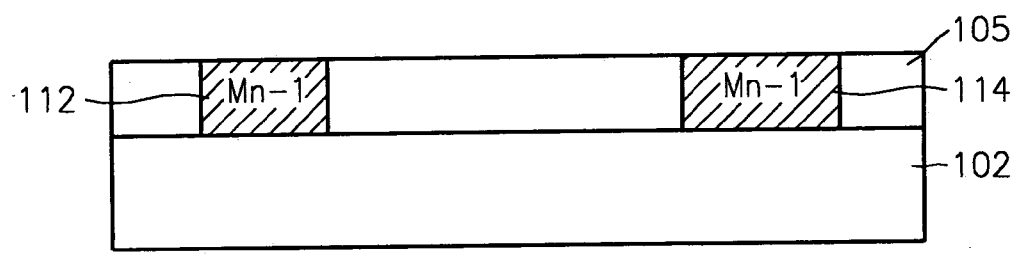

FIGS. 30 and 31 are cross-sectional views illustrating portions of a method of manufacturing the MIM capacitor shown in FIG. 6 using the layout shown in FIG. 4.

As shown in FIG. 30, a conductive layer in a MIM level is formed on a lower interlayer dielectric layer 102 and is patterned using conventional photolithography, thus forming first and second wire layers 112 and 114. An interlayer dielectric layer 105 is formed having a predetermined thickness so that the first and second wire layers 112 and 114 can be isolated from each other.

As shown in FIG. 31, a CMP process is performed on the interlayer dielectric layer 105 so that it can be level with the top surfaces of the first and second wire layers 112 and 114. As a result of the CMP process, the first and second wire layers 112 and 114 are electrically isolated and planarized. Subsequent processes are the same or similar as the corresponding processes described above with reference to FIGS. 27 through 29.

Figure 32:
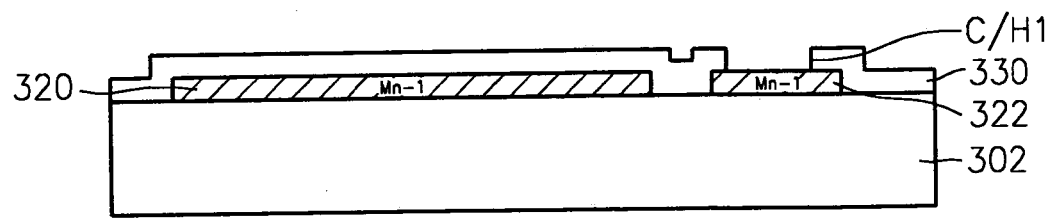
FIG. 32 is a cross-sectional diagram illustrating a method for manufacturing a MIM capacitor shown in FIG. 25.

Next, a method for manufacturing a portion of the MIM capacitor according to the third embodiment of the present invention, which is shown in FIG. 25, will be described with reference to FIG. 32.

A conductive layer in a $M_n$ level is formed on a lower interlayer dielectric layer 302 and is patterned using conventional photolithography, thus forming a lower electrode 320 and a first wire layer 322. Next, a dielectric layer 330 is deposited and is patterned, thus forming a contact hole C/H1, through which the first wire layer 322 is exposed. Subsequent processes may be performed using methods which are well known to the one in the art, thus forming an MIM capacitor having the cross-section shown in FIG. 25.

Those skilled in the art recognize that the MIM capacitor described herein can be implemented in many different variations. Therefore, although various embodiments are specifically illustrated and described herein, it will be appreciated that modifications and variations of the present invention are covered by the above teachings and within the purview of the appending claims without departing from the spirit and intended scope of the invention.

What is claimed is:

1. A capacitor formed on a semiconductor substrate, the capacitor comprising:
    a first electrode region of a first stair-stepped metal layer;
    a contact region that is a part of the first stair-stepped metal layer;
    a second electrode of a second metal layer that is closer to the substrate than the first stair-stepped metal layer;
    a dielectric layer intermediate the first electrode region and the second electrode, the dielectric layer including a contact opening therethrough in the vicinity of the contact region,
    wherein the first stair-stepped metal layer in a stair-stepped region thereof steps laterally and downwardly across the dielectric layer and into and at least partway laterally across the contact opening; and
    a wire electrically coupled to and in contact with a bottom surface of the contact region of the first stair-stepped metal layer through the contact opening in the dielectric layer,
    wherein the first electrode region is electrically coupled to the wire through the contact opening in the dielectric layer.

2. The capacitor of claim 1 wherein the wire is formed of a third metal layer that is closer to the substrate than the second metal layer.

3. The capacitor of claim 1 wherein the wire is formed of the second metal layer.

4. The capacitor of claim 1 wherein the contact opening comprises a plurality of separate contact holes.

5. The capacitor of claim 1 wherein the wire has a planarized top surface.

6. The capacitor of claim 5 wherein the wire comprises a damascene layer.

7. A metal-insulator-metal capacitor, comprising:
    a wire layer formed in a first metal layer, the wire layer including a first electrode contacting line;
    a bottom electrode formed in a second metal layer;
    wherein the wire layer comprises a second electrode contacting line, and wherein the second electrode contacting line is coupled to a bottom surface of the bottom electrode;
    a top electrode formed in a third metal layer, the top electrode disposed over the bottom electrode;
    a dielectric layer separating the bottom electrode from the top electrode;
    a contact formed between the first electrode contacting line and a bottom side of the top electrode; and
    a second contact located on a top side of the bottom electrode,
    wherein a portion of the bottom surface of the bottom electrode directly contacts a top surface of the second electrode contacting line and not through a contact hole.

8. The capacitor of claim 7 wherein the bottom electrode couples to the second electrode contacting line through a contact hole in an insulation layer.

9. The capacitor of claim 7 wherein the first and second electrode contacting lines each have a planarized top surface.

10. The capacitor of claim 9 wherein the first and second contacting lines are planarized by a damascene process.

11. The capacitor of claim 9 wherein the first and second contacting lines are planarized by a CMP process performed on an interlayer dielectric layer.

12. The capacitor of claim 7 wherein a top surface of the first and second contacting lines are formed in a process other than planarization.

13. The capacitor of claim 7 wherein the second contact extends away from a substrate farther than the third metal layer.

14. A metal-insulator-metal capacitor, comprising:
 a first metal layer including a bottom electrode and an electrode contacting line;
 a top stair-stepped electrode formed in a second metal layer, the top electrode disposed over the bottom electrode;
 a dielectric layer separating the bottom electrode from the top electrode;
 a contact formed between the electrode contacting line and a bottom side of the top electrode; and
 a second contact located on a top side of the bottom electrode.

15. A metal-insulator-metal capacitor, comprising:
 a first metal layer including a bottom electrode and an electrode contacting line;
 a top electrode formed in a second metal layer, the top electrode disposed over the bottom electrode;
 a dielectric layer separating the bottom electrode from the top electrode;
 a contact formed between the electrode contacting line and a bottom side of the top electrode; and
 a second contact located on a top side of the bottom electrode,
 wherein the top electrode couples to the electrode contacting line through a contact hole in the dielectric layer.

16. The capacitor of claim 15 wherein the contact hole comprises a plurality of separate holes.

17. The capacitor of claim 15, wherein the second contact extends away from a substrate farther than the second metal layer.

18. The capacitor of claim 15 wherein the bottom electrode and the electrode contacting line each have a planarized top surface.

19. The capacitor of claim 18 wherein the bottom electrode and the electrode contacting line are planarized by a damascene process.

20. The capacitor of claim 18 wherein the bottom electrode and the electrode contacting line are planarized by a CMP process performed on an interlayer dielectric layer.

21. The capacitor of claim 15 wherein the bottom electrode and the electrode contacting line are formed in a process other than planarization.

22. A metal-insulator-metal capacitor, comprising:
 a wire layer formed in a first metal layer, the wire layer including a first electrode contacting line;
 a bottom electrode formed in a second metal layer;
 a stair-stepped top electrode formed in a third metal layer, the top electrode disposed over the bottom electrode;
 a dielectric layer separating the bottom electrode from the top electrode; and
 a contact formed between the electrode contacting line and a bottom side of the top electrode, wherein the top electrode couples to the first electrode contacting line through a contact hole in the dielectric layer, the contact hole having a vertical:horizontal aspect ratio of less than about 1:1.

* * * * *

UNITED STATES PATENT AND TRADEMARK OFFICE
CERTIFICATE OF CORRECTION

PATENT NO. : 7,154,162 B2 Page 1 of 1
APPLICATION NO. : 10/678531
DATED : December 26, 2006
INVENTOR(S) : Jeong-Hoon Ahn et al.

It is certified that error appears in the above-identified patent and that said Letters Patent is hereby corrected as shown below:

Column 9, line 35, the word "MIM" should read -- $M_{n-1}$ --.

Signed and Sealed this

Twenty-sixth Day of August, 2008

JON W. DUDAS
*Director of the United States Patent and Trademark Office*